United States Patent [19]
Champagne et al.

[11] Patent Number: 5,428,296
[45] Date of Patent: Jun. 27, 1995

[54] PROBE ASSEMBLY FOR MEASURING RESISTIVITY OF A SOIL, AND METHOD THEREOF

[75] Inventors: Gilles Y. Champagne, Ste-Julie; Alexandre Monarque, Boucherville, both of Canada

[73] Assignee: Hydro-Quebec, Montreal, Canada

[21] Appl. No.: 888,592

[22] Filed: May 27, 1992

[51] Int. Cl.$^6$ .............................. G01R 27/26
[52] U.S. Cl. ..................... 324/696; 324/109
[58] Field of Search ........ 324/72, 109, 696, 354, 324/724, 713, 715; 422/82.02; 204/401, 402, 412

[56] References Cited

U.S. PATENT DOCUMENTS

| | | | |
|---|---|---|---|
| 293,518 | 2/1884 | Prince | 324/354 |
| 681,654 | 8/1901 | McClatchey | 324/354 |
| 817,749 | 4/1906 | Brown | 324/354 |
| 2,054,067 | 9/1936 | Blau et al. | 324/354 |
| 2,172,778 | 9/1939 | Taylor, Jr. | 324/354 |
| 2,461,111 | 2/1949 | Flinspach et al. | 324/696 |
| 3,757,212 | 9/1973 | Johnson | 324/696 |
| 3,927,370 | 12/1975 | De Bough | 324/696 |
| 4,137,495 | 1/1979 | Brown | 324/696 |
| 4,266,787 | 5/1981 | Slough | 324/71.2 |
| 4,514,722 | 4/1985 | Batcheler et al. | 324/696 |

FOREIGN PATENT DOCUMENTS

| | | | |
|---|---|---|---|
| 42756 | 10/1959 | Germany | 324/109 |
| 972908 | 11/1966 | Germany | 324/109 |

OTHER PUBLICATIONS

Electrometers, Keithley Instruments Mar. 1953.

*Primary Examiner*—Maura K. Regan
*Attorney, Agent, or Firm*—Foley & Lardner

[57] ABSTRACT

A probe assembly for measuring resistivity of a soil is connected to a measuring apparatus capable of generating a constant DC current signal into two electric leads. The probe assembly includes a short circuit connector; double-pole double-throw switch having two fixed contacts, and two switched contacts alternatively connectable to the electric leads or to the short circuit connector, respectively; and two electrodes connected to the fixed contacts respectively. Each of the electrodes has a portion of its surface forming a conductive surface. The conductive surfaces are substantially opposite to each other when the electrodes are put into the soil. In a stand-by position, the switched contacts are connected to the short circuit connector. In an operating position for measurement, the switched contacts are connected to the electrical leads, whereby when a measurement is performed, the switched contacts are switched from the stand-by position to the operating position so that the DC current signal can be injected into the electrodes and produce a voltage between the electrical leads that is indicative of the resistivity of the soil between said electrodes.

16 Claims, 2 Drawing Sheets

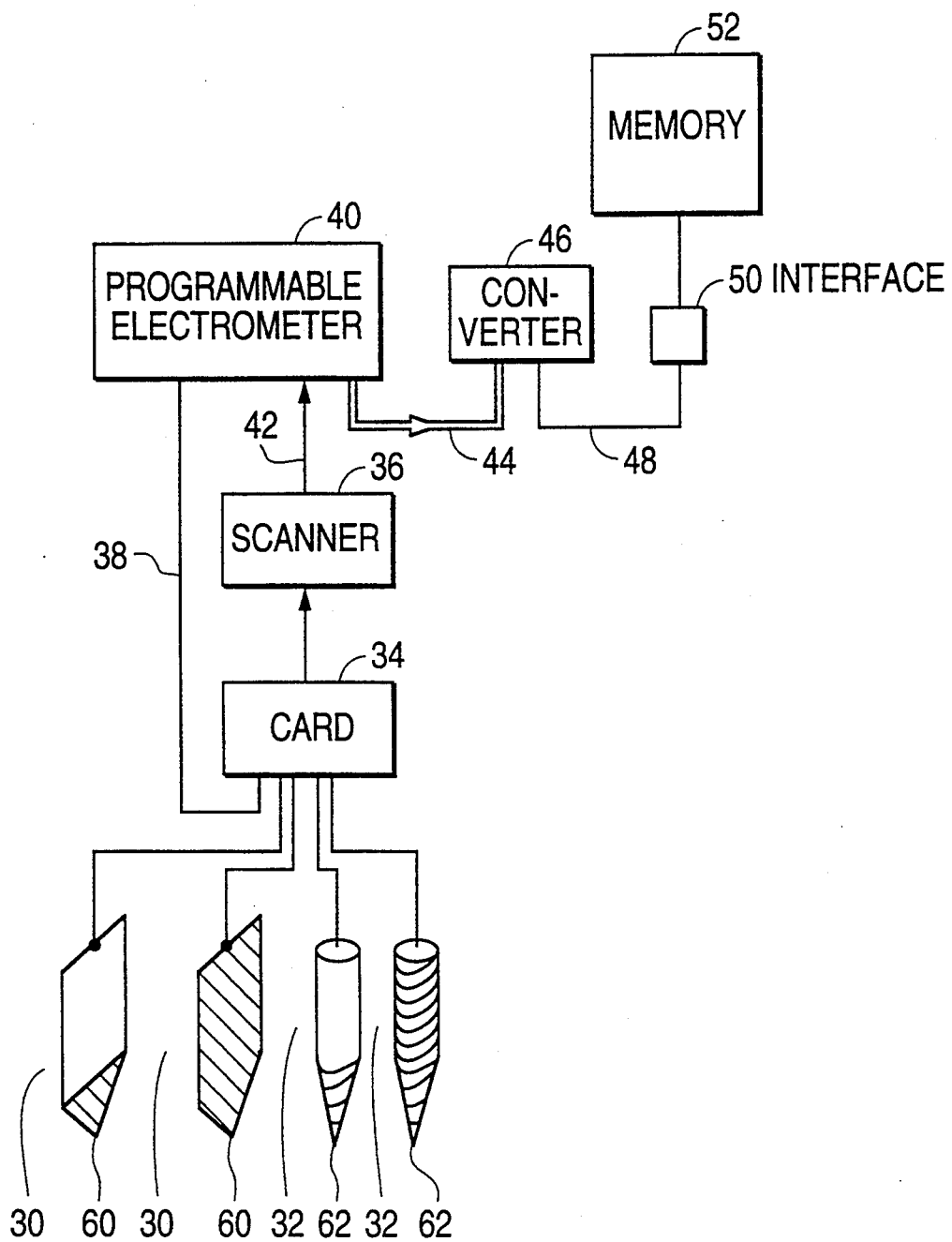

PROBE ASSEMBLY FOR MEASURING RESISTIVITY OF A SOIL, AND METHOD THEREOF

BACKGROUND OF THE INVENTION

The present invention relates to a probe assembly and a method for measuring resistivity of a soil. The probe assembly is adapted to be connected to a measurement apparatus capable of generating a constant DC current signal into two electric leads.

Since the electrical resistivity of the soil can change with moisture content and temperature, and since soil is used as electrical isolating material, the measurement of soil resistivity is therefore important.

Known in the art, there is the Schlumberger method which is one of the principal means for measuring soil electrical resistivity. This method determines the voltage drop between two electrodes, caused by a current flow between a second pair of electrodes. The first pair of electrodes is mounted between the second pair of electrodes. By measuring the resistance between the first pair of electrodes, and assuming hemispherical current flow in homogeneous soil, it is possible to measure the resistivity which is related to the resistance that is measured. In order to minimize errors from polarization of the soil, or existing earth currents, the current source is usually AC or chopped DC current at a frequency which is neither 60 Hz nor a harmonic of 60 Hz. In urban areas, where the conditions around a structure can be markedly different from those in the nearby soil, the present method is not appropriate.

It has been found that the Schlumberger method can be relatively efficient for measuring the resistivity of the soil at certain depths in the soil but is not efficient for measuring the resistivity of a thin layer of the soil located at or nearby the surface. Also it has been found that the measurement of the soil with the Schlumberger method cannot be done in a continuous manner because of polarization of the soil that is produced.

It is an object of the present invention to provide a probe assembly and a method by which it is possible to measure the resistivity of a thin layer of the soil located at or nearby the surface.

It is also an object of the present invention to provide a probe assembly and a method by which the resistivity of the soil can be measured without producing polarization of the soil.

SUMMARY OF THE INVENTION

According to the present invention, there is provided a probe assembly for measuring resistivity of a soil, to be connected to a measuring apparatus capable of generating a constant DC current signal into two electric leads, comprising:

a short circuit connector having two ends;

double-pole double-throw switching means having two fixed contacts, and two switched contacts alternatively connectable to said electric leads or to said short circuit connector, respectively; and two electrodes connected to said fixed contacts respectively, each of said electrodes having a portion of its surface forming a conductive surface, said conductive surfaces of said electrodes being substantially opposite to each other when said electrodes are put into said soil; in a stand-by position, said switched contacts being connected to said short circuit connector; in an operating position for measurement, said switched contacts being connected to said electrical leads of said measuring apparatus, whereby when a measurement of the resistivity of said soil is performed, said switched contacts are switched from said stand-by position to said operating position so that said DC current signal can be injected into said electrodes and produce a voltage between said electrical leads that is indicative of the resistivity of said soil between said electrodes.

Also, according to the present invention, there is provided a method for measuring resistivity of a soil, comprising the steps of:

putting two electrodes in said soil at predetermined depths, at a predetermined distance from each other, and with their conductive surfaces facing each other;

short circuiting said electrodes by means of a short circuit connector when no measurement of resistivity is performed;

opening said short circuit connector and injecting a constant DC current signal into said electrodes when a measurement of resistivity is performed to produce a voltage between said electrodes that is indicative of the resistivity of said soil between said electrodes, said constant DC current signal having a predetermined amplitude to prevent an electrolytic polarization of said soil, said circuit connector being opened during a sufficient time period to allow a stabilisation of said voltage produced between said electrodes.

The objects, advantages and other features of the present invention will become more apparent upon reading of the following non restrictive description of preferred embodiment thereof, given for the purpose of exemplification only with reference to the accompanying drawings.

BRIEF DESCRIPTION OF THE DRAWINGS

FIG. 2 is a schematic diagram illustrated in part in block diagram, showing an embodiment of the present invention in combination with an automatic measuring apparatus.

DETAILED DESCRIPTION OF THE DRAWINGS

Figure 1:
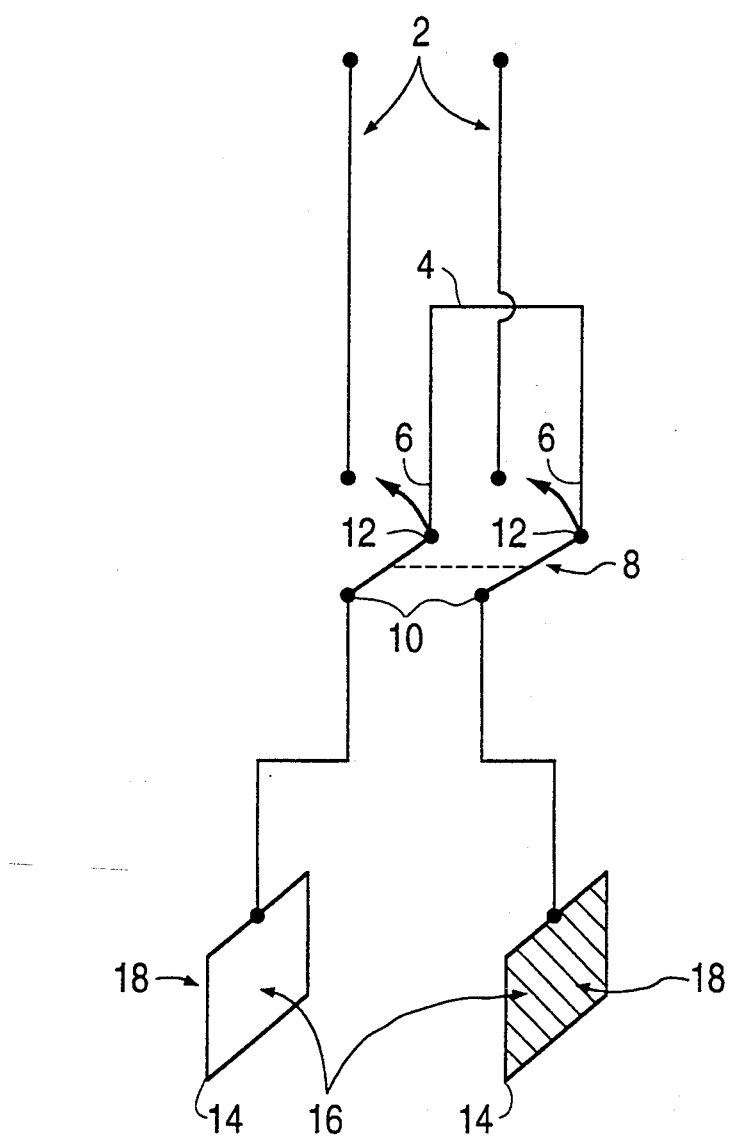
FIG. 1 is a schematic view illustrating a probe assembly in accordance with the present invention.

Referring now to FIG. 1, there is shown a probe assembly for measuring resistivity of a soil. This probe assembly is to be connected to a measuring apparatus (not shown in this FIG. 1) capable of generating a constant DC current signal into two electric leads 2.

The probe assembly comprises a short circuit connector 4 having two ends 6; and a double-pole double-throw switch 8 having two fixed contacts 10, and two switched contacts 12 alternatively connectable to the electric leads 2 or to the short circuit connector 4, respectively.

The probe assembly also comprises two electrodes 14 connected to the fixed contacts 10 respectively. Each of the electrodes 14 has a portion 16 of its surface, forming a conductive surface 16. The conducting surfaces 16 of the electrodes 14 are substantially opposite to each other when the electrodes are put into the soil. In a stand-by position, the switched contacts 12 are connected to the short circuit connector 4. In an operating position for measurement, the switched contacts are connected to the electrical leads 2 of the measuring apparatus (not shown), whereby when a measurement of the resistivity of the soil is performed, the switched contacts 12 are switched from the stand-by position to the operating position so that the DC current signal can be injected into the electrodes 14 and produce a voltage between the electrical leads 2 that is indicative of the resistivity of the soil between the electrodes 14.

The electrodes 14 are square-shaped plates. But other shapes are also possible.

Each of the electrodes 14 has a remaining portion 18 of its surface that does not form the conductive surface 16 and that is covered with an isolating material. The isolating material can be spray paint. The electrodes 14 are made of copper.

In operation, the method for measuring resistivity of the soil comprises steps of putting the two electrodes 14 in the soil at predetermined depths, at predetermined distances from each other and with their conductive surfaces 16 facing each other; short circuiting the electrodes 14 by means of the short circuit connector 4 when no measurement of resistivity is performed; and opening the short circuit connector 4 and injecting a constant DC current signal into the electrodes 14 when a measurement of resistivity is performed to produce a voltage between the electrodes 14 that is indicative of the resistivity of the soil between the electrodes. The constant DC current signal has a predetermined amplitude to prevent an electrolytic polarization of the soil. The circuit connector is opened during a sufficient time period to allow a stabilisation of the voltage produced between the electrodes. Preferably, the sufficient time period is at least sixty seconds.

For example, the DC current signal can be of 10 $\mu$A to 100 $\mu$A, and the predetermined distance can be of 20 to 90 cm.

Referring now to FIG. 2, there is shown the probe assembly in question in combination with a measuring apparatus for automatically taking a sampling of different measurements of the resistivity of the soil. There are shown two pairs of electrodes 30 and 32 that are connected to a Keithley (trademark) card which is a switching device 34 that can perform the same function as the double-pole double-throw switch 8 (shown in FIG. 1) for several pairs of electrodes 30 and 34. The Keithley card 32 is controlled by a model 705 Keithley scanner 36 which will connect in sequence each pair of electrodes 30 or 32 to a signal line 38 and at the same time will trigger the model 617 Keithley programmable electrometer 40 by sending a trigger signal onto trigger line 42. The different signals received from the electrodes by the electrometer 40 are converted into digital signals and sent on a IEEE bus 44 to a model serial 488A IOTECH (trademark) RS232/IEEE converter 46 to convert the electric signals coming from the IEEE bus 44 into a signal that will be sent on RS232 bus 48. This RS232 bus 48 is connected to an input interface 50 which is a model 336-3 INMAC (trademark) shielded null modem which is connected to an electronic memory 52 which is a model 2050S tracker 2000 (trademark) for storing all the information that is received.

By means of the programmable electrometer 40, the scanner 36 and the switching device 34, it is possible to momentarily open the short circuit connector between each pair of electrodes 30 or 32 in a successive manner to perform a sampling of different resistivity measurements with respect to time.

The programmable electrometer 40 comprises a constant DC current source for generating the DC current signal which is of 10 $\mu$A to 100 $\mu$A, and a DC voltmeter for detecting the voltage between the electric leads connected to each pair of electrodes 30 and 32.

Each of the electrodes 30 is substantially rectangular with one of its narrow side terminated by a pointed end 60 so that the electrodes 30 can be easily put into the soil. The pointed ends 60 is covered with an isolating material which can be spray paint.

Each of the electrodes 32 is a cylindrical rod with pointed ends 62 so that the electrodes 32 can be easily put into the soil. In this FIG. 2, the portion of the electrodes 30 and 32 that are not covered with transverse lines, are free from isolating material.

EXPERIMENTAL RESULTS

The soil where different measurements have been taken has been divided in three zones. These zones are divided into two main zones and one smaller zone. This division of the tested area takes into consideration the drain and the inclination of the ground. The two main zones comprise an undrained zone and a drained zone covering the drain itself. The two zones are separated by a secondary zone. To determined the influence of the draining off, a similar distribution of the electrodes in the soil has been used in each main zone. Thus, three electrode systems have been mounted in the drained zone and three other equivalent electrode systems in the undrained zone.

The first and second electrode systems consist of two pairs of electrodes mounted in each of the main zones. The first pair of electrodes is made of copper plates having dimensions of 0.30 meter by 0.30 meter, and the second pair of electrodes is also made of plates of copper having dimensions of 0.10 meter by 0.10 meter. Each plate of copper has one of its faces covered with an isolating paint. These plates are put into the soil during the preparation of the testing ground or after. The electrodes are mounted opposite to one another with their painted face turned toward the outside. The space between the plates is approximately between 0.20 and 0.90 meter.

A third electrode system is mounted in each of the main zones. This third system is a network of electrodes made of four steel rods covered with copper. Each rod has a length of 0.30 meter and a diameter of 0.016 meter. These electrodes are equidistant and aligned, the distance between adjacent electrodes being 0.88 meter. By means of this third system, a measurement according to the Schlumberger method can be performed.

By means of the two first electrode systems, the method according to the present invention has been performed. Generally speaking, this method requires the injection of an electric current into the soil. The resistivity of the soil is mainly determined by injecting a constant DC current into the soil by means of electrodes, and measuring the voltage between the electrodes. By means of the third electrode system, the four point Schlumberger method has been performed. This method has been used for comparison with the results obtained with the present invention.

During the test, the electrometer used was a model 617 electrometer made by Keithley (trademark). The volume of soil present between the electrodes is equivalent to a resistance. The electrometer measures the value of the average apparent resistance R of the soil. This value R once, it has been measured, allows the calculation of the value of the apparent resistivity of the soil present between the electrodes. This calculation is made by means of the following equation $p=R(A/L)$, where A is the surface of the transverse cross-section of the volume of soil present between the electrodes, L is the distance between the electrodes and R is the average apparent resistance of the soil, measured by the electrometer.

The above-mentioned equation establishes a link between the measured resistance, the distance between the electrodes and the surface of the transverse cross-section. Also, according to the above-mentioned equation, the volume of the soil between the electrodes is considered as a medium where the electric resistivity is homogeneous.

A corrective factor k is introduced to the above equation which becomes $p=Rk(A/L)$ to subtract the influence of the measurement system. An homogeneous electrical medium for which p is known, is used to determine the corrective factor k. To establish this factor k, each set of electrodes has been submerged in a KCl solution of 0.01 molar at predetermined distances.

The operation of the Schlumberger measurement system is well known. A DC current i is injected between the pair of external electrodes. By means of the two inner electrodes, the apparatus measures a voltage V. From the relation $V=RI$, the value of the average apparent resistance R is established. By means of the value of R, the average apparent resistivity p of the soil is determined by means of the Schlumberger relation: $p=2\pi iR$.

When the copper electrodes are put into the soil, there is produced a spontaneous polarization of the electrodes. This potential difference between the electrodes can be measured.

A potential difference of approximately 0.20 volt has been measured between the plates of 0.09 m$^2$. This value is sufficient to produce an important change in the resistance values measured by the electrometer which operates with a constant DC current. It has been found that this spontaneous polarization can be prevented by connecting the electrodes together when no measurement is performed.

The method according to the present invention has been developed and adapted to measure the resistivity of a soil while preventing, by means of a short circuit connection, the presence of a parasitic phenomena also called spontaneous polarization, which introduced errors in the values that are measured. With the present invention, it is possible to determine the influence of certain climatic conditions such as ambient temperature and rain, on the resistivity of the soil, which is not the case with the Schlumberger method by which it is very difficult or impossible to obtain a true value of the soil resistivity with respect to variations of climatic conditions.

Although the present invention has been explained hereinabove by way of a preferred embodiment thereof, it should be pointed out that any modifications to this preferred embodiment within the scope of the appended claims is not deemed to alter or change the nature and scope of the present invention.

The embodiments of the invention in which an exclusive property or privilege is claimed are defined as follows:

1. Probe assembly for measuring resistivity of a soil, to be connected to a measuring apparatus capable of generating a constant DC current signal into two electric leads, comprising:
    a short circuit connector having two ends;
    double-pole double-throw switching means having two fixed contacts, and two switched contacts alternatively connectable to said electric leads or to said short circuit connector, respectively; and
    two electrodes connected to said fixed contacts respectively, each of said electrodes having a portion of its surface forming a conductive surface, said conductive surfaces of said electrodes being substantially opposite to each other when said electrodes are put into said soil; in a stand-by position, said switched contacts being connected to said short circuit connector; in an operating position for measurement, said switched contacts being connected to said electrical leads of said measuring apparatus, said switched contacts being switched from said stand-by position to said operating position, said DC current signal being injected into said electrodes and producing a voltage between said electrical leads indicative of the resistivity of said soil between said electrodes.

2. A probe assembly according to claim 1, wherein each of said electrodes is substantially rectangular with one of its narrow sides terminated by a pointed end so that said electrodes can be easily put into said soil, said pointed end being covered with an isolating material.

3. A probe assembly according to claim 1, wherein said electrodes are square-shaped plates.

4. A probe assembly according to claim 1, wherein said electrodes are cylindrical rods with pointed ends so that said electrodes can be easily put into said soil.

5. A probe assembly according to claim 2, wherein each of said electrodes has a remaining portion of its surface that does not form said conductive surface, and that is covered with an isolating material.

6. A probe assembly according to claim 5, wherein said electrodes are made of copper.

7. A probe assembly according to claim 6, wherein said isolating material is spray paint.

8. A probe assembly according to claim 1, in combination with said measuring apparatus, wherein said measuring apparatus comprises:
    a constant DC current source for generating said DC current signal which is of 10 $\mu$A to 100 $\mu$A; and
    a DC voltmeter for detecting said voltage between said electric leads.

9. A probe assembly in combination with a measuring apparatus according to claim 8, further comprising a trigger signal generator having a command output connected to said double-pole double-throw switching means for momentarily switching said switched contacts from said stand-by position to said operating position, whereby a measurement of the resistivity of said soil can be sampled with respect to time by means of said trigger signal generator.

10. A method for measuring resistivity of a soil, comprising the steps of:
    putting two electrodes in said soil at predetermined depths, at a predetermined distance from each other, and with their conductive surfaces facing each other;
    short circuiting said electrodes by means of a short circuit connector when no measurement of resistivity is performed;
    opening said short circuit connector and injecting a constant DC current signal into said electrodes when a measurement of resistivity is performed to produce a voltage between said electrodes that is indicative of the resistivity of said soil between said electrodes, wherein said constant DC current signal has a predetermined amplitude to prevent an electrolytic polarization of said soil, and said circuit connector is opened during a sufficient time period to allow a stabilization of said voltage produced between said electrodes.

11. A method according to claim 10, wherein said DC current signal is substantially of 10 $\mu$A to 100 $\mu$A.

12. A method according to claim 10, wherein said predetermined distance is substantially of 20 to 70 centimeters.

13. A method according to claim 10, wherein said step of opening comprises a step of momentarily opening said short circuit connector in a successive manner to perform a sampling of resistivity measurements with respect to time.

14. A method according to claim 13, wherein said sufficient time period is at least 60 seconds.

15. A probe assembly according to claim 1, wherein each of said electrodes has a first face covered with isolating material and a second face forming the conductive surface, the second face of one electrode facing the second face of the other electrode.

16. A method according to claim 10, including the steps of providing a first face of each electrode with isolating material and a second face of each electrode with the conductive surface, and placing the second face of one electrode facing the second face of the other electrode.

* * * * *